US011831129B2

(12) United States Patent
Barve et al.

(10) Patent No.: US 11,831,129 B2
(45) Date of Patent: Nov. 28, 2023

(54) VERTICAL CAVITY SURFACE EMITTING LASER DESIGN WITH SHORTER OXIDATION LENGTH AND/OR LARGER NUMBER OF TRENCHES

(71) Applicant: Lumentum Operations LLC, San Jose, CA (US)

(72) Inventors: Ajit Vijay Barve, San Jose, CA (US); Mohammad Ali Shirazi Hosseini Dokht, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 281 days.

(21) Appl. No.: 17/188,701

(22) Filed: Mar. 1, 2021

(65) Prior Publication Data

US 2022/0200240 A1    Jun. 23, 2022

Related U.S. Application Data

(60) Provisional application No. 63/129,871, filed on Dec. 23, 2020.

(51) Int. Cl.
| | |
|---|---|
| *H01S 5/183* | (2006.01) |
| *H01S 5/042* | (2006.01) |
| *H01S 5/10* | (2021.01) |
| *H01S 5/42* | (2006.01) |

(52) U.S. Cl.
CPC ...... *H01S 5/18313* (2013.01); *H01S 5/04254* (2019.08); *H01S 5/04256* (2019.08); *H01S 5/1071* (2013.01); *H01S 5/18327* (2013.01); *H01S 5/18347* (2013.01); *H01S 5/423* (2013.01)

(58) Field of Classification Search
CPC ..... H01S 5/18308–18397; H01S 5/423; H01S 5/04254–04257
See application file for complete search history.

(56) References Cited

U.S. PATENT DOCUMENTS

| | | | |
|---|---|---|---|
| 9,742,153 B1* | 8/2017 | Barve | H01S 5/423 |
| 10,720,758 B2 | 7/2020 | Yuen et al. | |
| 2004/0101009 A1* | 5/2004 | Johnson | H01S 5/04254 |
| | | | 372/46.013 |
| 2012/0171790 A1* | 7/2012 | Ikuta | H01S 5/18311 |
| | | | 438/29 |
| 2017/0373471 A1* | 12/2017 | Kropp | H01S 5/305 |
| 2019/0305522 A1* | 10/2019 | Yuen | H01S 5/423 |
| 2020/0280175 A1* | 9/2020 | Lee | H01S 5/18311 |

\* cited by examiner

*Primary Examiner* — Minsun O Harvey
*Assistant Examiner* — Stephen Sutton Kotter
(74) *Attorney, Agent, or Firm* — Harrity & Harrity, LLP

(57) ABSTRACT

In some implementations, a surface emitting laser may have an emitter design with a short oxidation length and/or a large number of trenches. For example, the surface emitting laser may comprise a metallization layer comprising multiple extended portions extending outwards from a circumference of an inner ring portion, and multiple tabs extending laterally from the multiple extended portions in a partial ring shape. The surface emitting laser may further comprise multiple via openings connecting the metallization layer to a plating metal, where each via opening is positioned over a corresponding tab, of the multiple tabs. The surface emitting laser may comprise multiple oxidation trenches that are each formed in an angular gap between a pair of extended portions, of the multiple extended portions, such that the multiple tabs and the multiple via openings are exclusively outside outer radii of the multiple oxidation trenches.

20 Claims, 7 Drawing Sheets

VERTICAL CAVITY SURFACE EMITTING LASER DESIGN WITH SHORTER OXIDATION LENGTH AND/OR LARGER NUMBER OF TRENCHES

CROSS-REFERENCE TO RELATED APPLICATION

This Patent Application claims priority to U.S. Provisional Patent Application No. 63/129,871, filed on Dec. 23, 2020, and entitled "VERTICAL CAVITY SURFACE EMITTING LASER DESIGN WITH SHORTER OXIDATION LENGTH AND/OR LARGER NUMBER OF TRENCHES." The disclosure of the prior Application is considered part of and is incorporated by reference into this Patent Application.

TECHNICAL FIELD

The present disclosure relates generally to a vertical-cavity surface-emitting laser (VCSEL) and to an emitter design that enables a VCSEL to have a short oxidation length and/or a large number of trench etch regions.

BACKGROUND

A vertical-emitting device, such as a vertical-cavity surface-emitting laser (VCSEL), is a laser in which a laser beam is emitted in a direction parallel a surface of a substrate (e.g., vertically from a surface of a semiconductor wafer). In contrast to edge-emitting devices, vertical-emitting devices may allow for testing to occur at intermediate steps of wafer fabrication.

SUMMARY

In some implementations, a vertical cavity surface emitting laser (VCSEL) includes an implant protection layer comprising a circular portion; a p-ohmic metal layer comprising a ring portion, a plurality of extended portions extending outwards from a circumference of the ring portion, and a plurality of tabs extending laterally from the plurality of extended portions, wherein the p-ohmic metal layer is formed on the implant protection layer; a plurality of via openings, formed on a via layer, connecting the p-ohmic metal layer to a plating metal layer, wherein a via opening, of the plurality of via openings, is positioned over a tab, of the plurality of tabs of the p-ohmic metal layer; and a plurality of oxidation trenches, wherein the plurality of extended portions of the p-ohmic metal layer extend outside outer radii of the plurality of oxidation trenches such that the plurality of tabs and the plurality of via openings are exclusively outside the outer radii of the plurality of oxidation trenches.

In some implementations, a surface emitting laser includes an ohmic metallization layer comprising an inner ring portion, a plurality of extended portions extending outwards from a circumference of the inner ring portion, and a plurality of tabs extending laterally from the plurality of extended portions in a partial ring shape; a plurality of via openings connecting the ohmic metallization layer to a plating metal, wherein each via opening, of the plurality of via openings, is positioned over a corresponding tab, of the plurality of tabs; and a plurality of oxidation trenches that are each formed in an angular gap between a pair of extended portions, of the plurality of extended portions, such that the plurality of tabs and the plurality of via openings are exclusively outside outer radii of the plurality of oxidation trenches.

In some implementations, a laser array includes a plurality of VCSELs, wherein the plurality of VCSELs each have an oxide aperture larger than 15 micrometers, wherein a minimum emitter-to-emitter distance between two VCSELs, of the plurality of VCSELs, is larger than 30 micrometers, and wherein a VCSEL, of the plurality of VCSELs, comprises: an ohmic metallization layer comprising an inner ring portion, a plurality of extended portions extending outwards from a circumference of the inner ring portion, and a plurality of tabs extending laterally from the plurality of extended portions in a partial ring shape; a plurality of via openings that are each positioned over a corresponding tab, of the plurality of tabs; and a plurality of oxidation trenches that are each formed in an angular gap between a pair of adjacent extended portions, of the plurality of extended portions, such that the plurality of tabs and the plurality of via openings are exclusively outside outer radii of the plurality of oxidation trenches.

DETAILED DESCRIPTION

Figure 1A:
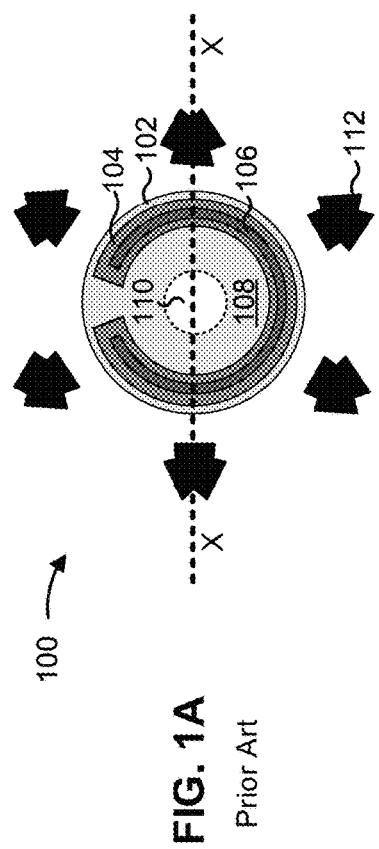
FIG. 1A is a diagram illustrating a top view of an example emitter.

The following detailed description of example implementations refers to the accompanying drawings. The same reference numbers in different drawings may identify the same or similar elements.

A vertical-emitting device, such as a vertical-cavity surface-emitting laser (VCSEL), is a laser in which a laser beam is emitted in a direction parallel to a surface of a substrate (e.g., vertically from a surface of a semiconductor wafer). In contrast to edge-emitting devices, vertical-emitting devices may allow for testing to occur at intermediate steps of wafer fabrication. In some cases, multiple vertical-emitting devices may be arranged to form an array. For example, multiple vertical-emitting devices (herein referred to as emitters) may be arranged to form a VCSEL array, such as a grid VCSEL array (e.g., where multiple emitters are uniformly spaced and oxidation trenches may be shared by two or more emitters) or a non-grid VCSEL array (e.g., where multiple emitters are not uniformly spaced and each emitter requires a set of oxidation trenches which may or may not be shared).

One factor when designing a VCSEL array is a density of emitters within the VCSEL array. Increasing the density of emitters within the VCSEL array (e.g., reducing space between the emitters) may allow for a reduction in size and/or a reduction in cost of an integrated circuit (IC) on which the VCSEL array is constructed (e.g., while achieving a same power output as a VCSEL array without reduced spacing). For a non-grid VCSEL array (e.g., where the emitters are arranged at non-uniform distances and/or angles with respect to each other), each emitter may need a separate set of oxidation trenches. This may introduce a limit on minimum spacing between emitters of the VCSEL array (e.g., for a given set of design rules associated with manufacturing the VCSEL array), thereby limiting the density of the non-grid VCSEL array. One technique by which the spacing between the emitters in the non-grid VCSEL array may be reduced is by decreasing widths of one or more emitter layers, such as a trench layer (e.g., a set of oxidation trenches), a p-ohmic metal layer, and/or a dielectric via opening. However, such a reduction may be difficult and/or impossible due to fabrication limitations associated with manufacturing the emitters and/or design considerations associated with the emitters.

Accordingly, in some cases, an emitter may be designed with a compact layout that enables a spacing between emitters of a VCSEL array to be reduced, thereby allowing for increased emitter density within the VCSEL array while achieving the same or a similar performance level. For example, FIGS. 2A-2C and FIG. 2E, which are described in further detail below, provide example compact emitter layouts that allow a reduction in size for various emitters that are included in a VCSEL array without sacrificing overall performance (e.g., in terms of an output power, wavelength, emission profile, and/or reliability). For example, the reduction in emitter spacing may be achieved by using a split architecture for one or more emitter layers, such as a p-ohmic metal layer (e.g., a metal layer), an implant protection layer (e.g., formed by an isolation material), and/or a dielectric via opening. The split architecture may generally allow spaces between oxidation trenches to be utilized by causing the one or more emitter layers (e.g., the p-ohmic metal layer and the dielectric via opening) to be interdigitized with the oxidation trenches (e.g., such that extended portions of the one or more layers lie partially between respective oxidation trenches, as shown in FIGS. 2A-2C and FIG. 2E). Due to the utilization of the spaces between the oxidation trenches, a size of the emitter may be reduced, thereby allowing for increased emitter density in a non-grid VCSEL array.

In some cases, despite enabling an increased emitter density and offering a balance between performance, reliability, and manufacturability, compact emitter designs may suffer from various drawbacks when a shorter oxidation length and/or a larger number of trenches are needed. For example, in a VCSEL, current is often confined within an oxide aperture by oxidizing material around the oxide aperture of the VCSEL in a direction from an oxidation trench towards the oxide aperture. Accordingly, in a compact emitter design with oxidation trenches located relatively far away from the oxide aperture, a larger amount of material may need to be oxidized. If the oxidation trenches are moved closer to the oxide aperture, a distance between adjacent oxidation trenches may be significantly higher than (e.g., more than two times) the oxidation length, which can result in carrier leakage. One potential approach to mitigate the carrier leakage and preserve carrier confinement (e.g., where oxidation blocks current flow outside the oxide aperture) is to reduce the distance between adjacent trenches by reducing p-metal and/or via feature sizes. However, the smaller feature sizes cause fabrication challenges.

Some implementations described herein provide an emitter layout that enables a shorter oxidation length (e.g., below five microns (5 μm)) and/or a large number of trenches (e.g., more than nine (9) trenches) with a significantly higher manufacturing tolerance than compact emitter layouts, and without compromising performance or reliability. For example, as described in further detail herein, the emitter layout may include an ohmic metallization layer that has an inner ring portion, various extended portions extending outwards from a circumference of the inner ring portion, and various tabs that extend laterally from the extended portions in a partial ring shape. Accordingly, in some implementations, via openings connecting the ohmic metallization layer to a plating metal may each be positioned over a corresponding tab, whereby oxidation trenches can be formed in an angular gap between a pair of extended portions in the ohmic metallization layer such that the various tabs and via openings are exclusively outside outer radii of the oxidation trenches. In this way, the oxidation trenches may be located closer to the oxide aperture, which enables an emitter design with a shorter oxidation length and/or a larger number of trenches without introducing carrier leakage and/or small feature sizes that may be challenging from a manufacturing perspective.

Figure 1B:
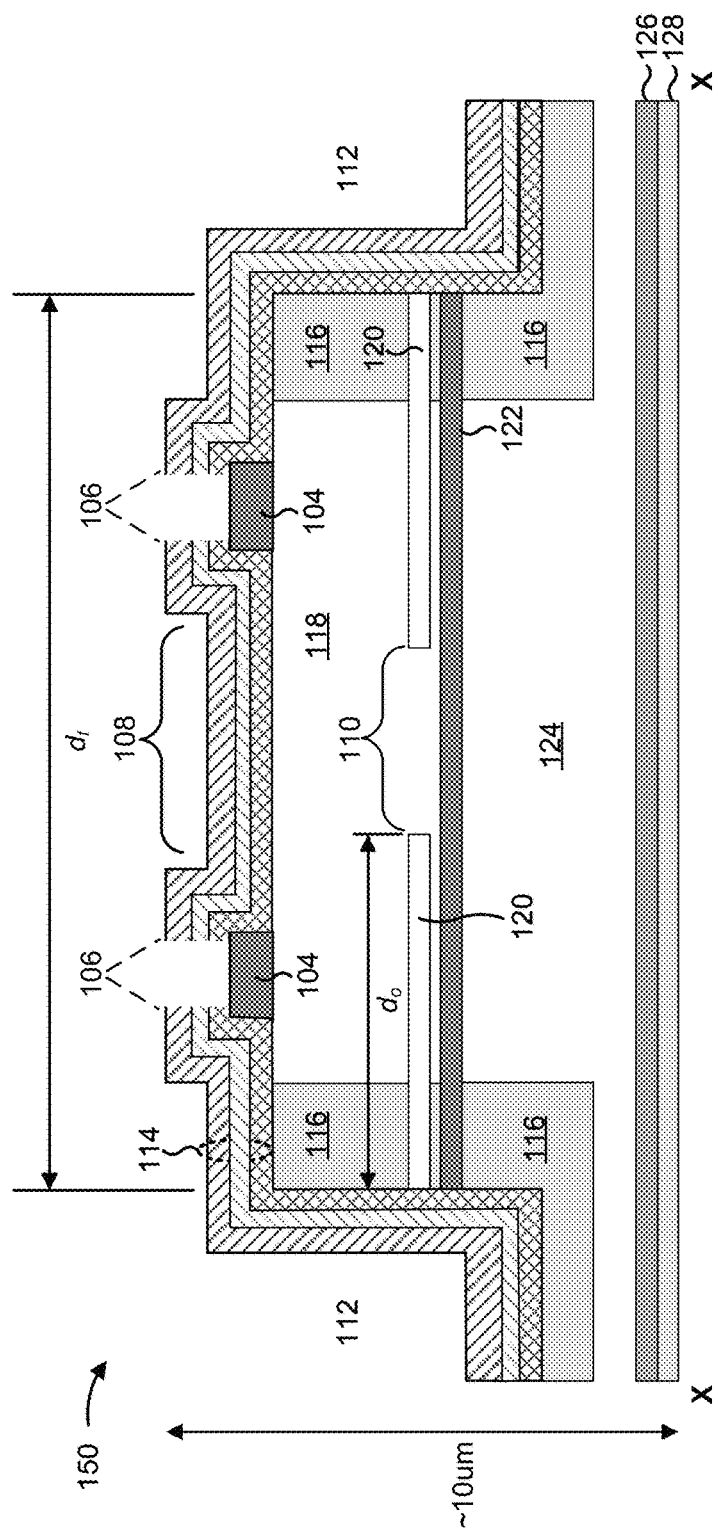
FIG. 1B is a diagram illustrating a cross-sectional view of an example emitter.

FIGS. 1A-1B are diagrams depicting a top-view of an example emitter 100 and a cross-sectional view 150 of the emitter 100 along the line X-X, respectively. As shown in FIG. 1A, the emitter 100 may include a set of emitter layers constructed in an emitter architecture. In some implementations, the emitter 100 may correspond to one or more vertical-emitting devices described herein. Additionally, or alternatively, a vertical-emitting device described herein may include one or more components and/or features of the emitter 100 shown in FIGS. 1A-1B.

As shown in FIG. 1A, the emitter 100 may include an implant protection layer 102, that is circular in shape in this example. In some implementations, the implant protection layer 102 may have another shape, such as an elliptical shape and/or a polygonal shape, among other examples. The implant protection layer 102 is defined based on a space between sections of implant material (not shown) included in the emitter 100.

As shown in FIG. 1A, the emitter 100 includes an ohmic metal layer 104 (e.g., a p-ohmic metal layer or an n-ohmic metal layer) that is constructed in a partial ring-shape (e.g., with an inner radius and an outer radius). In FIG. 1A, the medium gray area shows an area of the ohmic metal layer 104 that is covered by a protective layer (e.g., a dielectric layer and/or a passivation layer) and the dark gray area shows an area of the ohmic metal layer 104 that is exposed by a via 106, as described in more detail below. As shown, the ohmic metal layer 104 overlaps with the implant protection layer 102. Such an arrangement may be used, for example, in cases where the emitter 100 has a p-up/top-emitting configuration. In cases where the emitter 100 has a bottom-emitting configuration, the arrangement of the ohmic metal layer 104 and the implant protection layer 102 may be adjusted as needed.

Not shown in FIG. 1A, the emitter 100 includes a protective layer in which a via 106 is formed (e.g., etched). The dark gray area shows an area of the ohmic metal layer 104 that is exposed by the via 106 (e.g., the shape of the dark gray area may be a result of the shape of the via 106) while the medium gray area shows an area of the ohmic metal layer 104 that is covered by the protective layer. The protective layer may cover all of the emitter 100 other than the vias 106. As shown, the via 106 is formed in a partial ring-shape (e.g., similar to the ohmic metal layer 104) and is formed over the ohmic metal layer 104 such that metallization on the protection layer contacts the ohmic metal layer 104. In some implementations, the via 106 and/or the ohmic metal layer 104 may be formed in another shape, such as a full ring-shape or a split ring-shape.

As further shown, the emitter 100 includes an optical aperture 108 in a portion of the emitter 100 within the inner radius of the partial ring-shape of the ohmic metal layer 104. The emitter 100 emits a laser beam via the optical aperture 108. As further shown, the emitter 100 also includes an oxide aperture 110 (e.g., a current confinement aperture) formed by an oxidation layer of the emitter 100 (not shown) formed below optical aperture 108.

As further shown in FIG. 1A, the emitter 100 includes a set of trenches 112 (e.g., oxidation trenches) that are spaced (e.g., equally, unequally) around a circumference of the implant protection layer 102. How closely the trenches 112 can be positioned relative to the optical aperture 108 is dependent on the application, and is typically limited by the implant protection layer 102, the ohmic metal layer 104, the via 106, and manufacturing tolerances.

The number and arrangement of layers shown in FIG. 1A are provided as an example. In practice, the emitter 100 may include additional layers, fewer layers, different layers, or differently arranged layers than those shown in FIG. 1A. For example, while the emitter 100 includes a set of six trenches 112, in practice, other configurations are possible, such as a compact emitter that includes five trenches 112, seven trenches 112, and/or the like. In some implementations, a trench 112 may encircle the emitter 100 to form a mesa structure cit. As another example, while the emitter 100 is a circular emitter design, in practice, other designs may be used, such as a rectangular emitter, a hexagonal emitter, and/or an elliptical emitter. Additionally, or alternatively, a set of layers (e.g., one or more layers) of the emitter 100 may perform one or more functions described as being performed by another set of layers of the emitter 100, respectively.

Notably, while the design of the emitter 100 is described herein as including a VCSEL, other implementations are possible. For example, the design of the emitter 100 may apply in the context of another type of optical device, such as a light emitting diode (LED), or another type of vertical emitting (e.g., top emitting or bottom emitting) optical device. Additionally, the design of the emitter 100 may apply to emitters of any wavelength, power level, and/or emission profile. In other words, the emitter 100 is not particular to an emitter with a given performance characteristic.

As shown in FIG. 1B, the example cross-sectional view 150 may represent a cross-section of the emitter 100 that passes through, or between, a pair of trenches 112 (e.g., as shown by the line labeled "X-X" in FIG. 1A). As shown, the emitter 100 may include a backside cathode layer 128, a substrate layer 126, a bottom mirror 124, an active region 122, an oxidation layer 120, a top mirror 118, an implant isolation material 116, a protective layer 114 (e.g., a dielectric passivation/mirror layer), and an ohmic metal layer 104. As shown, the emitter 100 may have, for example, a total height that is approximately 10 μm.

The backside cathode layer 128 may include a layer that makes electrical contact with the substrate layer 126. For example, the backside cathode layer 128 may include an annealed metallization layer, such as a gold-germanium-nickel (AuGeNi) layer, a palladium-germanium-gold (PdGeAu) layer, or a layer made from another suitable material.

The substrate layer 126 may include a base substrate layer upon which epitaxial layers are grown. For example, the substrate layer 126 may include a semiconductor layer, such as a gallium arsenide (GaAs) layer, an indium phosphide (InP) layer, or a layer made from another suitable material.

The bottom mirror 124 may include a bottom reflector layer of the emitter 100. For example, the bottom mirror 124 may include a distributed Bragg reflector (DBR).

The active region 122 may include a layer that confines electrons and defines an emission wavelength of the emitter 100. For example, the active region 122 may be a quantum well.

The oxidation layer 120 may include an oxide layer that provides optical and electrical confinement of the emitter 100. In some implementations, the oxidation layer 120 may be formed as a result of wet oxidation of an epitaxial layer. For example, the oxidation layer 120 may be an aluminum oxide ($Al_2O_3$) layer formed as a result of oxidation of an aluminum arsenide (AlAs) or aluminum gallium arsenide (AlGaAs) layer. The trenches 112 may include openings that allow oxygen (e.g., dry oxygen, wet oxygen) to access the epitaxial layer from which the oxidation layer 120 is formed.

The oxide aperture 110 may include an optically active aperture defined by the oxidation layer 120. A size of the oxide aperture 110 may range, for example, from approximately 4 micrometers (μm) to approximately 20 μm. In some implementations, a size of the oxide aperture 110 may depend on a distance between the trenches 112 that surround the emitter 100. For example, the trenches 112 may be etched to expose the epitaxial layer from which the oxidation layer 120 is formed. Here, before the protective layer 114 is formed (e.g., deposited), oxidation of the epitaxial layer may occur for a particular distance (e.g., identified as $d_o$ in FIG. 1B) toward a center of the emitter 100, thereby forming the oxidation layer 120 and the oxide aperture 110. In some implementations, as described herein, the distance over which the epitaxial layer is oxidized may be referred to herein as an oxidation length ($L_{ox}$). In some implementations, the epitaxial layer may be oxidized around the oxide aperture 110 to confine current to within the oxide aperture 110. Additionally, or alternatively, current may be confined within the oxide aperture 110 using another suitable current confinement technique, such as an etched mesa, a region without ion implantation, and/or lithographically defined intra-cavity mesa and regrowth, among other examples.

The top mirror 118 may include a top reflector layer of emitter 100. For example, the top mirror 118 may include a DBR.

The implant isolation material 116 may include a material that provides electrical isolation. For example, the implant isolation material 116 may include an ion implanted material, such as a hydrogen/proton implanted material or a similar implanted element to reduce conductivity. In some implementations, the implant isolation material 116 may define the implant protection layer 102.

The protective layer 114 may include a layer that acts as a protective passivation layer and which may act as an additional DBR. For example, the protective layer 114 may include one or more sub-layers (e.g., a dielectric passivation layer and/or a mirror layer, a silicon dioxide ($SiO_2$) layer, a silicon nitride ($S_3N_4$) layer, an aluminum oxide ($Al_2O_3$) layer, or other layers) deposited (e.g., by chemical vapor deposition, atomic layer deposition, or other techniques) on one or more other layers of the emitter 100.

As shown, the protective layer 114 may include one or more vias 106 that provide electrical access to the ohmic metal layer 104. For example, the via(s) 106 may be formed as an etched portion of the protective layer 114 or a lifted-off section of the protective layer 114. The optical aperture 108 may include a portion of the protective layer 114 over the oxide aperture 110 through which light may be emitted.

The ohmic metal layer 104 may include a layer that makes electrical contact through which electrical current may flow. For example, the ohmic metal layer 104 may include a titanium (Ti) and gold (Au) layer, a Ti and platinum (Pt) layer and/or an Au layer, or the like, through which electrical current may flow (e.g., through a bondpad (not shown) that contacts the ohmic metal layer 104 through a via 106). The ohmic metal layer 104 may be p-ohmic, n-ohmic, or other forms known in the art. Selection of a particular type for the ohmic metal layer 104 may depend on the architecture of the emitters and is within the knowledge of a person skilled in the art. The ohmic metal layer 104 may provide ohmic contact between a metal and a semiconductor, may provide a non-rectifying electrical junction, and/or may provide a low-resistance contact. In some implementations, the emitter 100 may be manufactured using a series of steps. For example, the bottom mirror 124, the active region 122, the oxidation layer 120, and the top mirror 118 may be epitaxially grown on the substrate layer 126, after which the ohmic metal layer 104 may be deposited on the top mirror 118. Next, the trenches 112 may be etched to expose the oxidation layer 120 for oxidation. The implant isolation material 116 may be created via ion implantation, after which the protective layer 114 may be deposited. The via(s) 106 may be etched in the protective layer 114 (e.g., to expose the ohmic metal layer 104 for contact). Plating, seeding, and etching may be performed, after which the substrate layer 126 may be thinned and/or lapped to a target thickness. Finally, the backside cathode layer 128 may be deposited on a bottom side of the substrate layer 126.

The number, arrangement, thicknesses, order, symmetry, or the like, of layers shown in FIG. 1B are provided as an example. In practice, the emitter 100 may include additional layers, fewer layers, different layers, differently constructed layers, or differently arranged layers than those shown in FIG. 1B. Additionally, or alternatively, a set of layers (e.g., one or more layers) of the emitter 100 may perform one or more functions described as being performed by another set of layers of the emitter 100 and any layer may comprise more than one layer.

Figure 2A:
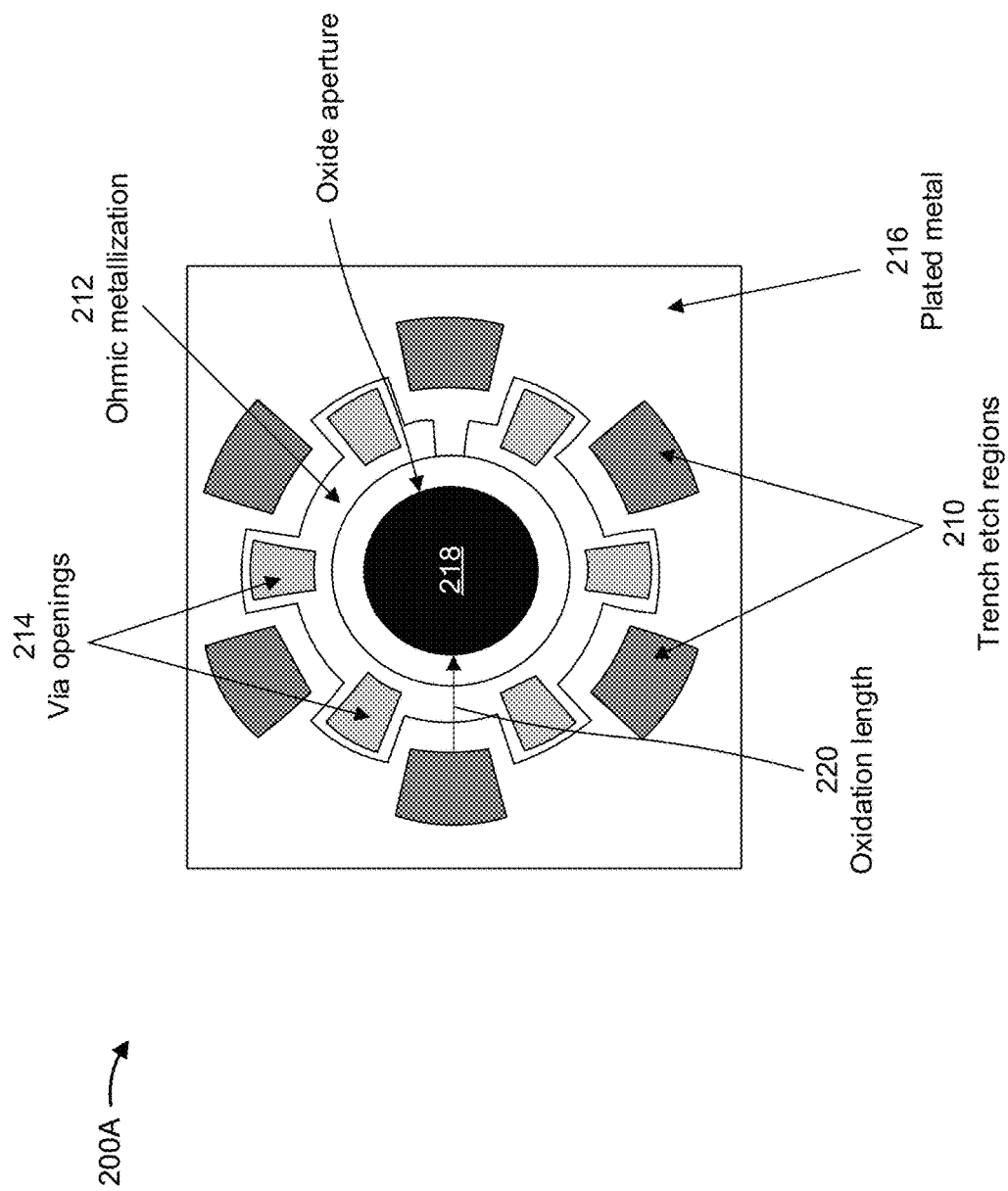
FIG. 2A is a diagram illustrating an example of a compact emitter layout that has a large oxidation length.
Figure 2B:
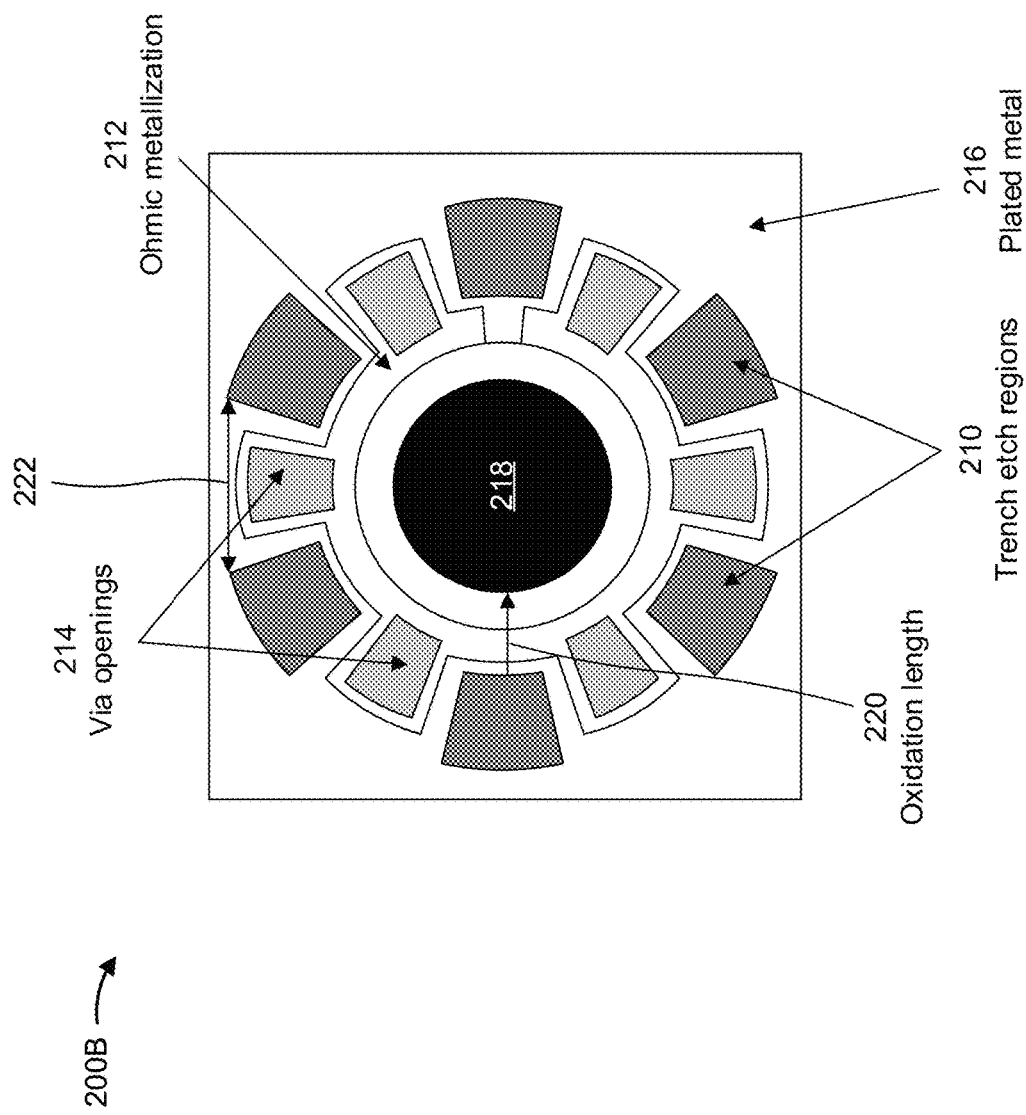
FIG. 2B is a diagram illustrating an example of a compact emitter layout that has an inter-trench distance that results in carrier leakage.
Figure 2C:
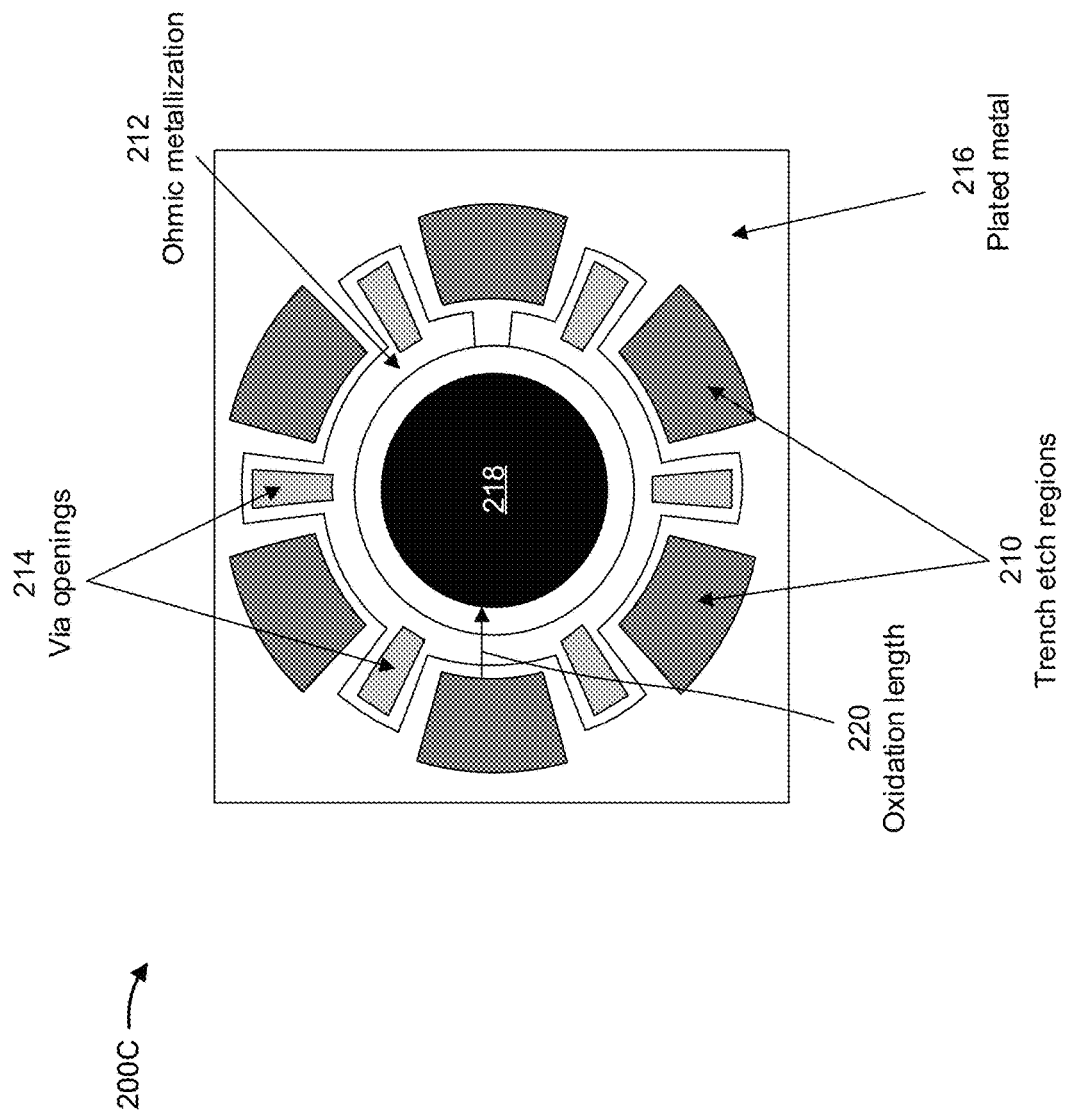
FIG. 2C is a diagram illustrating an example of a compact emitter layout that has a p-metal layer and a via layer with small feature sizes.
Figure 2D:
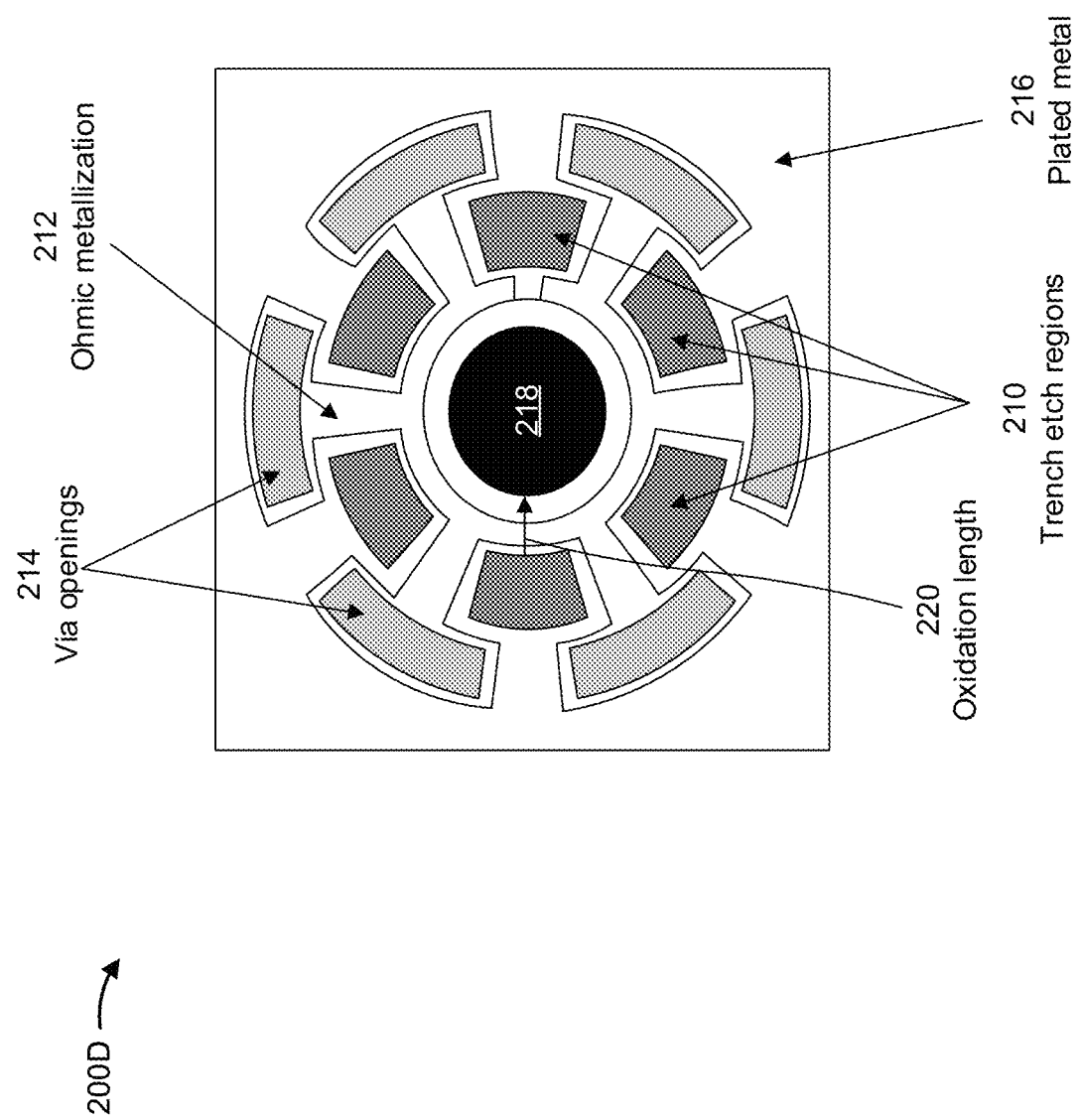
FIG. 2D is a diagram illustrating an example implementation of an emitter layout that enables a short oxidation length without causing carrier leakage or a reduction in feature sizes.
Figure 2E:
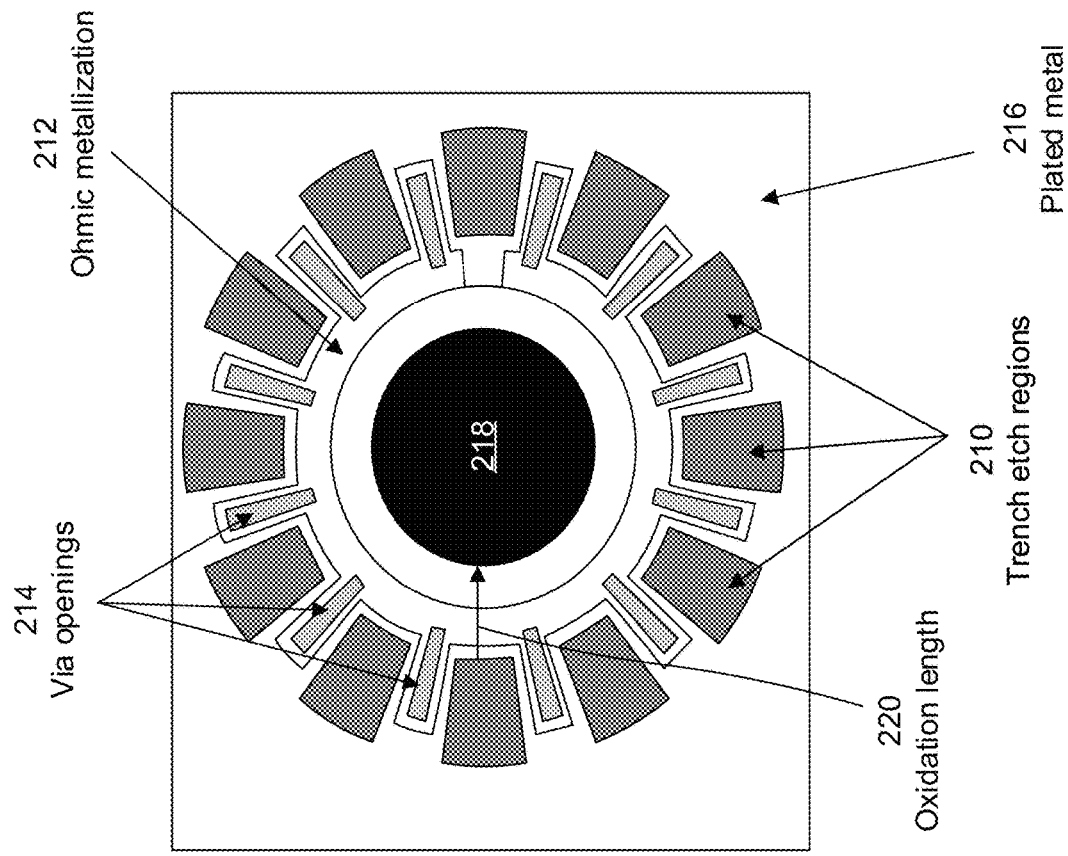
FIG. 2E is a diagram illustrating an example of a compact emitter layout that has a p-metal layer and a via layer with small feature sizes due to a large number of trenches.
Figure 2F:
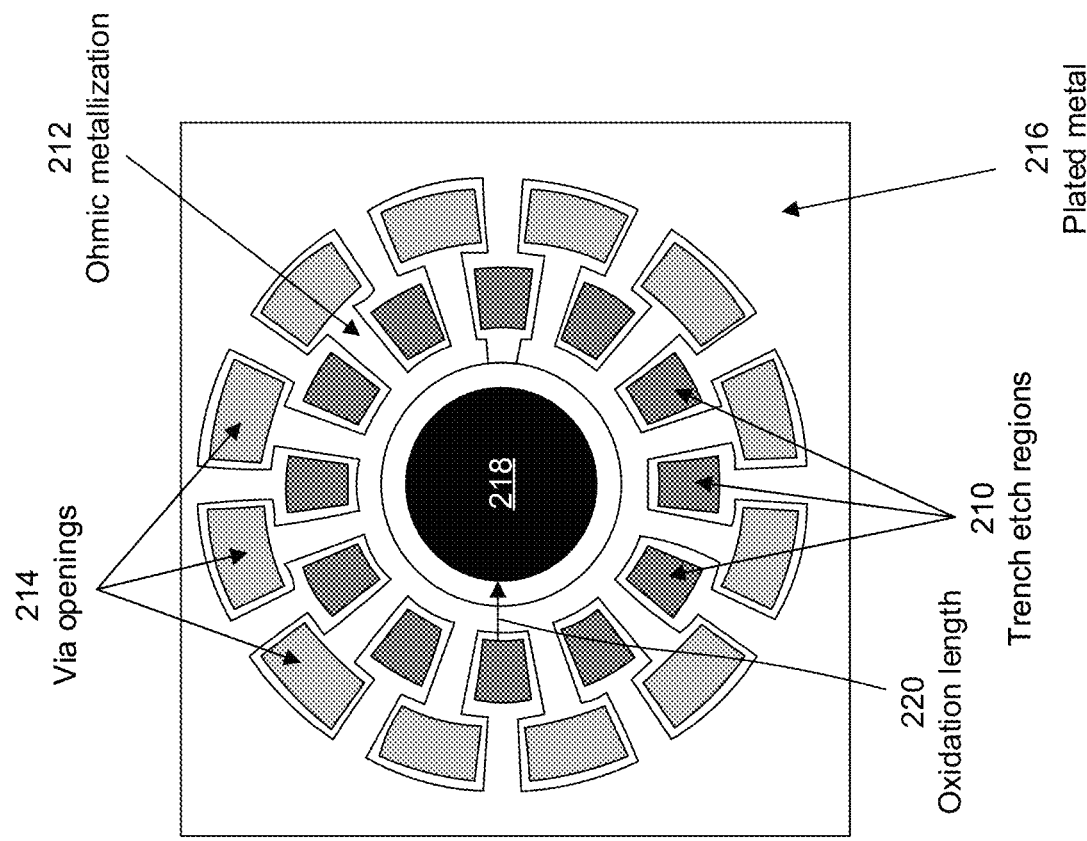
FIG. 2F is a diagram illustrating an example implementation of an emitter layout that enables a short oxidation length and a large number of trenches without causing carrier leakage or a reduction in feature sizes.

FIGS. 2A-2F are diagrams depicting top views of various emitter layouts. For example, as described in further detail herein, FIG. 2A is a diagram illustrating an example of a compact emitter layout 200A that has a large oxidation length, FIG. 2B is a diagram illustrating an example of a compact emitter layout 200B that has an inter-trench distance that results in carrier leakage, and FIG. 2C is a diagram illustrating an example of a compact emitter layout 200C that has a p-metal layer and a via layer with small feature sizes. Accordingly, FIG. 2D is a diagram illustrating an example implementation of an emitter layout 200D that enables a short oxidation length without causing carrier leakage or a reduction in feature sizes, thereby improving upon the compact emitter layouts 200A-200C shown in FIGS. 2A-2C. Furthermore, FIG. 2E is a diagram illustrating an example of a compact emitter layout 200E that has a p-metal layer and a via layer with small feature sizes due to a large number of trenches. Accordingly, FIG. 2F is a diagram illustrating an example implementation of an emitter layout 200F that enables a short oxidation length and a large number of trenches without causing carrier leakage or a reduction in feature sizes, thereby improving upon the compact emitter layout 200E shown in FIG. 2E.

As shown in FIG. 2A, a compact emitter layout 200A may use a split architecture or interdigitized design in order to reduce an overall size (e.g., as compared to the emitter 100 in FIG. 1A). As shown in FIG. 2A, the compact emitter layout 200A may include a p-ohmic metallization layer 212 that includes a ring portion and a set of partial ring-shaped extended portions (e.g., shaped as a set of teeth extending from and spaced around an outer circumference of the ring portion, for example in a cog wheel shape with a hollow center). Additionally, the compact emitter layout 200A may include an implant protection layer (which may be located below the p-ohmic metallization layer 212 and therefore not visible in the top view shown in FIG. 2A). For example, the implant protection layer may include a circular portion and a set of partial ring-shaped extended portions that are shaped as a set of teeth extending from and spaced around a circumference of the circular portion (e.g., in a cog wheel shape). In some implementations, the implant protection layer may be defined based on sections of isolation material included in the compact emitter layout 200A. As shown, the extended portions of the p-ohmic metallization layer 212 may overlap the extended portions of the implant protection layer.

As further shown in FIG. 2A, the compact emitter layout 200A may include a set of dielectric via openings 214 that are formed on a dielectric passivation/mirror layer (not shown). The dielectric via openings 214 may be arranged as multiple disconnected openings over the extended portions of the p-ohmic metallization layer 212. As shown, the dielectric via openings 214 may be formed in partial ring-shapes (e.g., similar to the extended portions of the p-ohmic metallization layer 212, for example disconnected concentric arcuate segments that are at least partially positioned over the p-ohmic metallization layer 212 such that metallization may contact the p-ohmic metallization layer 212 via the dielectric via openings 214). In some implementations, as shown, a plated metal layer 216 may be deposited on a dielectric layer in which the dielectric via openings 214 are formed (e.g., using e-beam evaporation, sputtering, or another suitable deposition technique). For example, the plated metal layer 216 may be deposited on the dielectric layer and may cover an entirety of the compact emitter layout 200A except for an oxide aperture 218 formed in a central portion of the compact emitter layout 200A (e.g., concentrically within the circular portion of the implant protection layer).

For example, the compact emitter layout 200A may include an optical aperture in a central portion of the compact emitter layout 200A, within the inner radius of the partial ring-shape of the p-ohmic metallization layer 212. For example, a laser beam may be emitted via the optical aperture. As further shown, the compact emitter layout 200A may include an oxide aperture 218, which is formed by an oxidation layer of the compact emitter layout 200A. For example, as described above with reference to FIGS. 1A-1B, oxidation of an epitaxial layer may occur for a particular distance towards the oxide aperture 218, thereby forming the oxidation layer and the oxide aperture 218. In some implementations, as described herein, the distance over which the epitaxial layer is oxidized may be referred to herein as an oxidation length (Lox) 220. In general, the oxide aperture 218 may be formed below the optical aperture, and the oxidation may be performed to confine current within the oxide aperture 218. Notably, the size of the oxide aperture 218 may be the same as the size of the oxide aperture 110 of the emitter 100 shown in FIGS. 1A-1B. In other words, even with the reduced size of the compact emitter layout 200A, the oxide aperture 218 is not reduced in size. Similarly, the inner radius of the p-ohmic metallization layer 212 may be the same as the inner radius of the p-ohmic metal layer 104 of the emitter 100 shown in FIGS. 1A-1B. Maintaining such widths and spacing may allow the compact emitter layout 200A to offer the same or comparable performance as the emitter 100.

As further shown in FIG. 2A, the compact emitter layout 200A may include a set of oxidation trenches 210, or trench etch regions (e.g., each of a partial ring-shape). As shown, in the compact emitter layout 200A, the oxidation trenches 210 are positioned partially between the dielectric via openings 214, the extended portions of the p-ohmic metallization layer 212, and the extended portions of the implant protection layer. While the oxidation trenches 210 are shown in FIG. 2A as disconnected concentric arcuate segments formed in a partial ring-shape, in some implementations, the oxidation trenches 210 may be formed in another shape, such as an irregular polygon shape. In some implementations, an overall width of the compact emitter layout 200A, from an outer edge of an oxidation trench 210 to an outer edge of an oppositely positioned oxidation trench 210, is less than 40 µm (e.g., the width of the emitter 100 shown in FIGS. 1A-1B). In some implementations, the width of the compact emitter layout 200A is less than 35 µm (e.g., approximately 32.4 µm) for an oxide aperture of 15 µm.

By allowing spaces between the oxidation trenches 210 to be utilized, the split architecture of the compact emitter layout 200A may result in a reduction in overall size (e.g., as compared to the emitter 100 shown in FIGS. 1A-1B). For example, the overall width of the compact emitter layout 200A may be 7.6 µm smaller (e.g., 40.0 µm-32.4 µm=7.6 µm), or approximately 20% smaller, than the overall width of the emitter 100 shown in FIGS. 1A-1B (e.g., [(40.0 µm-32.4 µm)/40 µm]×100%=19%). This increases emitter density when used in a non-grid VCSEL array, thereby reducing a size and/or a cost of an integrated circuit on which the non-grid VCSEL array is constructed. However, while the compact emitter layout 200A shown in FIG. 2A may offer a robust design, good performance, and reliability, the compact emitter layout 200A may not be suitable in scenarios where the oxidation length 220 (e.g., the distance over which an AlGaAs layer is oxidized during wet oxidation) is short with respect to the size (e.g., diameter) of the oxide aperture 218. For example, as shown in FIG. 2A, there is a space between the oxidation trenches 210 and the outer circumference of the ring portion of the p-ohmic metallization layer 212, which adds to the oxidation length 220. However, in some cases, performance may be improved by reducing the oxidation length 220 (e.g., using a smaller oxidation length 220 may reduce the space occupied by an emitter).

Accordingly, FIG. 2B illustrates an example of a compact emitter layout 200B with a shorter oxidation length 220, which is achieved by moving the oxidation trenches 210 closer to the outer circumference of the ring portion of the p-ohmic metallization 212 (e.g., by filling the space between the oxidation trenches 210 and the outer circumference of the ring portion of the p-ohmic metallization layer 212 in the compact emitter layout 200A of FIG. 2A). However, when using a shorter oxidation length, the oxidation trenches 210 are moved closer to the outer circumference of the ring portion of the p-ohmic metallization 212, an inter-trench distance between adjacent oxidation trenches 210 (shown with arrow 222 in FIG. 2B) is more than double the oxidation length. For example, in the compact emitter layout 200B shown in FIG. 2B, the oxidation trenches 210 are moved closer to the inner ring of the p-ohmic metallization 212, which results in the oxide aperture having a diameter of 10 µm and a reduced oxidation length 220 of 4.1 µm.

However, the compact emitter layout 200B shown in FIG. 2B presents performance issues, as moving the oxidation trenches 210 closer to the inner ring of p-ohmic metallization layer 212 might result in carrier leakage. For example, as described above, the p-ohmic metallization layer 212 is generally oxidized in a direction from the oxidation trenches 210 towards the center of the p-ohmic metallization layer 212, thereby forming the oxide aperture 218. In this case, where the inter-trench distance is more than twice the oxidation length 222, an area between adjacent oxidation trenches 210 may not be fully oxidized, which allows current to flow in the unoxidized area. Accordingly, the compact emitter layout 200B may cause a loss of carrier confinement within the oxide aperture, as current flows in unwanted areas where there is no oxidation to block the current flow.

One possible technique to avoid the undesirable carrier leakage that may occur when the oxidation trenches 210 are moved closer to the inner ring of p-ohmic metallization layer 212 (e.g., to shorten the oxidation length 220) is to reduce the inter-trench distance to be less than double the oxidation length 220. For example, FIG. 2C illustrates a compact emitter layout 200C in which the distance between the oxidation trenches 210 is reduced to be less than double the oxidation length by reducing the widths of the via openings 214 and the extended portions of the p-ohmic metallization layer 212 that the dielectric layer is deposited onto. However, as shown, reducing the widths of the via openings 214 and the extended portions of the p-ohmic metallization layer 212 results in very small feature sizes, especially for the p-ohmic metallization layer 212 and the dielectric layer in which the via openings 214 are formed. In this case, the compact emitter layout 200C shown in FIG. 2C may be challenging from a fabrication perspective due to the very small via openings 214 and/or the very small dimensions for the extended portions (e.g., the teeth-like portions) of the p-ohmic metallization layer 212. For example, as described herein, the via openings 214 correspond to etched regions in a dielectric layer that is deposited on the p-ohmic metallization layer 212 to provide an electrical connection between the p-ohmic metallization layer 212 (which is deposited directly on a semiconductor layer) and the plated metal layer 216 that is deposited on the dielectric layer.

Accordingly, in some implementations, FIG. 2D illustrates an improved emitter layout 200D having a design in which the p-ohmic metallization layer 212 includes p-metal tabs having a partial ring shape, which are extended outwards outside the oxidation trenches 210, and via openings 214 are exclusively outside outer radii of the oxidation trenches 210. For example, in the compact emitter layout 200D shown in FIG. 2D, an implant protection layer may include a circular portion, and the p-ohmic metallization layer 212 may be formed on the implant protection layer. As further shown, the p-ohmic metallization layer 212 may include a ring portion, a set of extended portions extending outwards from a circumference of the ring portion, and a set of tabs that extend laterally from the set of extended portions. For example, as shown, the extended portions may connect the various tabs to the inner ring portion of the p-ohmic metallization layer 212.

As further shown in FIG. 2D, the compact emitter layout 200D includes various via openings 214, which are formed on (e.g., etched into) a dielectric via layer and connect the p-ohmic metallization layer 212 to the plated metal layer 216. As shown, each via opening 214 is positioned over a tab in the p-ohmic metallization layer 212. Accordingly, as shown, there is an angular gap between the extended portions of the p-ohmic metallization layer 212, between the outer tabs and the via openings 214, whereby the oxidation trenches 210 may be formed in the angular gaps between the outer tabs and the via openings 214 (e.g., with the via openings 214 and the partial ring-shaped tabs of the p-ohmic metallization layer 212 located exclusively outside the outer radii of the oxidation trenches 210). In this way, the tabs of the p-ohmic metallization layer 212 and the via openings 214 do not need to have small feature sizes (e.g., the via openings 214 may be larger), which improves fabrication tolerance and design robustness. The emitter layout 200D shown in FIG. 2D is also advantageous for emitter designs with a larger number of trenches (most applicable for emitters with an oxide aperture 218 having a large diameter, such as 15 µm or greater).

For example, FIG. 2E is a diagram illustrating an example compact emitter layout 200E having an oxide aperture with a large diameter (e.g., an 18 µm diameter) and twelve (12) trenches. In cases where the designs shown in one or more of FIGS. 2A-2C are applied to the compact emitter layout 200E with a larger number of trenches 210 (e.g., 9 or more trenches), the architecture will result in the via openings 214 having an extremely narrow width, as shown in FIG. 2E. This is because the perimeter of the compact emitter layout 200E is divided into 12 parts and the minimum width of the oxidation trenches 210 is limited due to fabrication design rules (e.g., 2 µm-2.5 µm). Therefore, because the via openings 214 need to fit in a small angular gap between the oxidation trenches 210, a sweep angle for these structures becomes very small and not suitable for a robust fabrication flow. Accordingly, in some implementations, FIG. 2F illustrates an improved emitter layout 200F where the p-ohmic metallization layer 212 includes tabs that are extended outside the outer diameter of the oxidation trenches 210, which allows the p-ohmic metallization layer 212 and the corresponding via openings 214 to cover much larger sweep angles (e.g., a sweep angle of 25 degrees or larger for a design with 12 via openings 214, or a larger sweep angle if fewer via openings 214 are used). Therefore, extending the tabs of the p-ohmic metallization layer 212 and the via openings 214 outside the outer radii of the oxidation trenches 210 enables much wider design tolerances. In some cases, positioning the tabs of the p-ohmic metallization layer 212 and the via openings 214 to be outside the outer radii of the oxidation trenches 210 may generally result in the emitter layouts 200D, 200F having a larger overall size for an oxide aperture 218 having the same size. Therefore, the designs shown in FIG. 2D and FIG. 2F may be best suited for use in single emitter VCSELs or VCSEL arrays with an emitter-to-emitter distance that is large enough to fit the emitter layouts 200D, 200F. For example, in some implementations, the emitter layouts 200D, 200F may be used in a single emitter VCSEL or VCSEL array with an emitter-to-emitter distance larger than 30 µm (e.g., an oxide aperture 210 with an 18 µm diameter would need an emitter-to-emitter distance of ~34 µm).

The number and arrangement of layers shown in FIGS. 2A-2F are provided as an example. In practice, compact emitters 200A-200F may include additional layers, fewer layers, different layers, or differently arranged layers than those shown in FIGS. 2A-2F. For example, while compact emitters 200A-200D include a set of six oxidation trenches 210 and compact emitters 200E-200F include twelve oxidation trenches 210 (and the emitter layers of compact emitters 200A-200D are constructed accordingly), in practice, other designs are possible, such as a compact emitter that includes five oxidation trenches 210, seven oxidation trenches 210, or the like. Furthermore, the designs shown in FIG. 2D and FIG. 2F may work equally well when the number of via openings 214 is different than the number of oxidation trenches 210 (e.g., two via openings 214 and six trenches 210), because the via and metal traces do not need to be identical for every trench 210. For example, in some implementations, two or more via openings 214 may be combined into a single via opening 214 that covers a larger sweep angle, or all of the via openings 214 may be connected as a ring around the emitter.

As another example, while compact emitters 200A-200D are circular emitter designs, in practice, other designs are possible and the via openings 214 and p-ohmic metallization layer 212 can have different sizes and/or shapes, such as with a polygonal-shaped emitter, an elliptical-shaped emitter, or the like, without affecting performance or manufacturability. Additionally, or alternatively, the oxidation trenches 210 and corresponding "teeth" of the other layers may be evenly space or unevenly spaced. Additionally, or alternatively, a set of layers (e.g., one or more layers) of the emitter layouts 200A-200F may perform one or more functions described as being performed by another set of layers of the emitter layouts 200A-200F.

Notably, while the designs of emitter layouts 200A-200F are described as including a VCSEL, other implementations are possible. For example, the design of compact emitters 200A-200F may apply in the context of another type of optical device, such as a light emitting diode (LED), or another type of vertical emitting (e.g., top emitting or bottom emitting) optical device. Additionally, in some implementations, the designs of the emitter layouts 200A-200F may apply to emitters of any wavelength, power level, emission profile, or the like.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL), comprising:
    a p-ohmic metal layer comprising a ring portion, a plurality of extended portions extending outwards from a circumference of the ring portion, and a plurality of tabs extending laterally from the plurality of extended portions;
    a plurality of via openings, formed on a via layer, connecting the p-ohmic metal layer to a plating metal layer, wherein each via opening, of the plurality of via openings, is positioned exclusively over a corresponding tab, of the plurality of tabs of the p-ohmic metal layer; and
    a plurality of oxidation trenches, wherein the plurality of extended portions of the p-ohmic metal layer extend outside an outer radius of the plurality of oxidation trenches such that the plurality of tabs and the plurality of via openings are exclusively outside the outer radius of the plurality of oxidation trenches.

2. The VCSEL of claim 1,
    wherein a quantity of the plurality of via openings is equal to a quantity of the plurality of oxidation trenches.

3. The VCSEL of claim 1,
    wherein a quantity of the plurality of via openings is different from a quantity of the plurality of oxidation trenches.

4. The VCSEL of claim 1,
    wherein the plurality of tabs and the plurality of via openings are formed in a partial ring-shape.

5. The VCSEL of claim 1, further comprising:
    an oxide aperture formed concentrically within the ring portion of the p-ohmic metal layer, wherein the oxide aperture has a diameter larger than 15 micrometers.

6. The VCSEL of claim 5,
    wherein a maximum distance between adjacent oxidation trenches, of the plurality of oxidation trenches, is less than two times an oxidation length defined by a distance from an inner radius of an oxidation trench to a circumference of the oxide aperture.

7. The VCSEL of claim 1,
    wherein each oxidation trench, of the plurality of oxidation trenches, is formed in an angular gap between adjacent extended portions, of the plurality of extended portions of the p-ohmic metal layer.

8. The VCSEL of claim 1,
    wherein the plurality of tabs and the plurality of via openings are equally spaced around the circumference of the ring portion.

9. A surface emitting laser, comprising:
    an ohmic metallization layer comprising an inner ring portion, a plurality of extended portions extending outwards from a circumference of the inner ring portion, and a plurality of tabs extending laterally from the plurality of extended portions in a partial ring shape;
    a plurality of via openings connecting the ohmic metallization layer to a plating metal, wherein each via opening, of the plurality of via openings, is positioned exclusively over a corresponding tab, of the plurality of tabs; and
    a plurality of oxidation trenches that are each formed in an angular gap between a pair of extended portions, of the plurality of extended portions, such that the plurality of tabs and the plurality of via openings are exclusively outside an outer radius of the plurality of oxidation trenches.

10. The surface emitting laser of claim 9,
    wherein a maximum distance between adjacent oxidation trenches, of the plurality of oxidation trenches, is less than two times an oxidation length defined by a distance from an inner radius of an oxidation trench to a circumference of an oxide aperture formed concentrically within the inner ring portion of the ohmic metallization layer.

11. The surface emitting laser of claim 10,
    wherein the distance between the adjacent oxidation trenches causes current flow to be confined to within the oxide aperture.

12. The surface emitting laser of claim 9,
    wherein a quantity of the plurality of via openings is equal to a quantity of the plurality of extended portions and equal to a quantity of the plurality of oxidation trenches.

13. The surface emitting laser of claim 9,
    wherein a quantity of the plurality of via openings is less than a quantity of the plurality of extended portions or less than a quantity of the plurality of oxidation trenches.

14. The surface emitting laser of claim 9, comprising a single emitter vertical cavity surface emitting laser (VCSEL) or a VCSEL array with an emitter-to-emitter distance larger than 30 micrometers.

15. The surface emitting laser of claim 9,
    wherein each via opening, of the plurality of via openings, covers a sweep angle larger than 25 degrees.

16. A laser array, comprising:
a plurality of vertical cavity surface emitting lasers (VCSELs), wherein the plurality of VCSELs each have an oxide aperture larger than 15 micrometers, wherein a minimum emitter-to-emitter distance between two VCSELs, of the plurality of VCSELs, is larger than 30 micrometers, and
wherein a VCSEL, of the plurality of VCSELs, comprises:
- an ohmic metallization layer comprising an inner ring portion, a plurality of extended portions extending outwards from a circumference of the inner ring portion, and a plurality of tabs extending laterally from the plurality of extended portions in a partial ring shape;
- a plurality of via openings that are each positioned exclusively over a corresponding tab, of the plurality of tabs; and
- a plurality of oxidation trenches that are each formed in an angular gap between a pair of adjacent extended portions, of the plurality of extended portions, such that the plurality of tabs and the plurality of via openings are exclusively outside an outer radius of the plurality of oxidation trenches.

17. The laser array of claim 16,
wherein a maximum distance between adjacent oxidation trenches, of the plurality of oxidation trenches, is less than two times an oxidation length defined by a distance from inner radii of the plurality of oxidation trenches to the oxide aperture.

18. The laser array of claim 17,
wherein the distance between the adjacent oxidation trenches causes current flow to be confined to within the oxide aperture.

19. The laser array of claim 16,
wherein a quantity of the plurality of via openings is equal to a quantity of the plurality of extended portions and equal to a quantity of the plurality of oxidation trenches.

20. The laser array of claim 16,
wherein a quantity of the plurality of via openings is less than a quantity of the plurality of extended portions or less than a quantity of the plurality of oxidation trenches.

* * * * *